United States Patent [19]

Bai et al.

[11] Patent Number: 4,873,871
[45] Date of Patent: Oct. 17, 1989

[54] MECHANICAL FIELD EFFECT TRANSISTOR SENSOR

[75] Inventors: Monty W. Bai, Scottsdale; Douglas J. Huhmann, Tempe, both of Ariz.

[73] Assignee: Motorola, Inc., Schaumburg, Ill.

[21] Appl. No.: 207,993

[22] Filed: Jun. 17, 1988

[51] Int. Cl.⁴ .............................................. G01B 7/16
[52] U.S. Cl. ........................................ 73/777; 357/25
[58] Field of Search ............ 73/777, 717, 721, 862.64; 357/25, 26, 27

[56] References Cited

U.S. PATENT DOCUMENTS

| | | | |
|---|---|---|---|
| 3,440,873 | 4/1969 | Eichelberger | 73/777 X |
| 3,585,415 | 6/1971 | Muller | 357/26 X |
| 3,585,466 | 6/1971 | Davis, Jr. et al. | 357/26 |
| 3,973,146 | 8/1976 | Arnold et al. | 357/26 |
| 4,543,457 | 9/1985 | Petersen et al. | 200/83 N |
| 4,588,978 | 5/1986 | Allen | 340/58 |
| 4,614,119 | 9/1986 | Zavracky et al. | 73/704 |
| 4,636,714 | 1/1987 | Allen | 324/60 CD |
| 4,674,319 | 6/1987 | Muller et al. | 73/23 |
| 4,680,606 | 7/1987 | Knutti et al. | 357/26 |
| 4,711,128 | 12/1987 | Boura | 73/517 B |
| 4,739,381 | 4/1988 | Miura et al. | 357/26 |

FOREIGN PATENT DOCUMENTS

| | | | |
|---|---|---|---|
| 2175744 | 12/1986 | United Kingdom | 357/26 |
| 2183906 | 6/1987 | United Kingdom | 357/26 |

OTHER PUBLICATIONS

Chen, P. et al., Integrated Silicon . . . Accelerometer, IEEE Trans. on Electron Devices, vol. ED-29, No. 1, Jan. '82, pp. 27-33.

Swartz, R. et al., Integrated Silicon . . . Arrays, IEEE Trans. on Electron Devices, vol. ED-26, No. 12, Dec. '79, pp. 1921-1931.

Petersen, Kurt et al., Micromechanical Accelerometer . . . Circuitry, IEEE Trans. on Electron Devices, vol. ED-29, No. 1, Jan. '82, pp. 23-26.

Nathanson, H. C. et al., The Resonant Gate Transistor, IEEE Trans. on Electron Devices, vol. ED-14, No. 3, Mar. '67, pp. 117-133.

Primary Examiner—Jerry W. Myracle
Attorney, Agent, or Firm—Jordan C. Powell

[57] ABSTRACT

A mechanical field effect transistor sensor which has a drain and a source on a semiconductor portion, and a moveable gate which causes conduction between the drain and source when the gate is in proximity or touching the semiconductor portion. The gate in its preferred embodiment comprises a cantilever microbeam which allows movement of the gate up or down with respect to the semiconductor portion when a force is applied to the microbeam. The microbeam can be replaced with a diaphragm or a simply supported beam. The gate is coupled to an external voltage source which supplies a voltage to the gate causing the conduction between drain and source. Another embodiment uses a piezoelectric material for the gate which generates a voltage when it is compressed or expanded due to forces caused by changes in acceleration and magnetic fields.

9 Claims, 2 Drawing Sheets

MECHANICAL FIELD EFFECT TRANSISTOR SENSOR

BACKGROUND OF THE INVENTION

This invention relates, in general, to movement sensors detecting pressure, temperature, and acceleration, such as accelerometers, and more specifically, to mechanical sensors using semiconductor material.

Conventional sensors designed for measuring or detecting forces due to pressure, temperature, or acceleration, such as accelerometers, frequently incorporate deflectable diaphragms or cantilevered beams with contact points along the axis of deflection. As a force is applied to the deflectable member, the contact points are deflected towards stationary points situated opposite and adjacent to the contact points where they make physical contact. As the points contact, an electric signal is fed through the two points and into an electronic circuit. As the deflectable member is deflected farther due to additional forces, other contacts located along the member physically contact opposite stationary points, and supply similar signals to the electronic circuit. The circuit can then evaluate the signals received through these physical contacts to determine how far the deflectable member deflected. This allows the circuit to determine the forces applied to the sensor.

Modern sensors are frequently miniaturized and require micromachining. Due to the small size of the micromachined sensors, the contact points are very susceptible to corrosion and buildup which effects the performance of the sensor.

SUMMARY OF THE INVENTION

It is, therefore, an object of the present invention to avoid the problem of performance loss due to corrosion and buildup.

It is another object of the present invention to provide a mechanical sensor which utilizes semiconductor material.

Another object of the present invention is to provide a sensor which operates as a field effect transistor.

Still another object of the present invention is to allow operation of the sensor without actual physical contact of the separate elements of the sensor.

To achieve these objects and advantages, a mechanical field effect transistor (MFET) is contemplated. The drain and source of the MFET are stationary on a semiconductor substrate. However, the gate of the MFET is moveable with respect to the drain and source. There are two preferred embodiments of the gate. The first utilizes a cantilever microbeam or a diaphragm, both of which deflect when a force is applied. The gate itself is on the end of the microbeam or in the center of the diaphragm and is connected to a voltage source. As the beam or the diaphragm deflects toward the drain and source, the gate causes conduction within the semiconductor substrate even before the gate contacts the substrate. The second embodiment utilizes a piezoelectric crystal which is not connected to a voltage source. The gate utilizing the crystal is secured to the substrate. As the crystal deflects, it causes the electron concentration in the substrate to change allowing current flow between the drain and source.

Other objects and advantages of the present invention will become apparent from the following detailed description, particularly when considered in conjunction with the accompanying drawings.

DETAILED DESCRIPTION OF THE PREFERRED EMBODIMENT

Throughout the specification, the term mechanical field effect transistor will be abbreviated as MFET.

Figure 1:
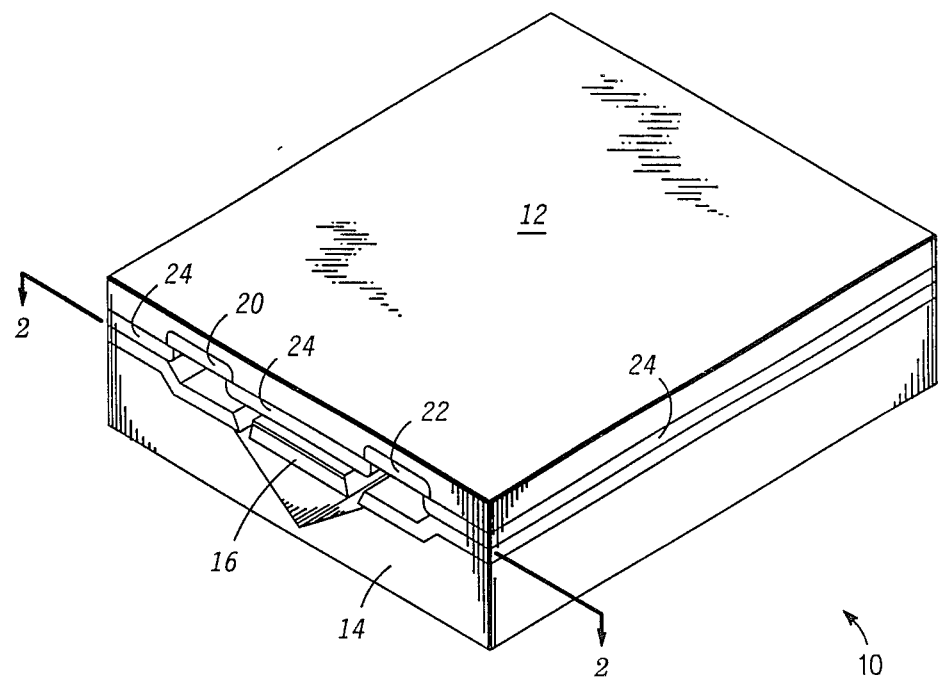
FIG. 1 is an isometric view of a mechanical field effect transistor sensor in its preferred embodiment in accordance with the present invention.

FIG. 1 shows a first embodiment of a MFET 10 in its preferred embodiment. MFET 10 comprises substrate 12, base 14, and microbeam 16. In this embodiment, microbeam 16 is a cantilevered beam.

Substrate 12 includes drain 20, source 22, and oxide layer 24. Substrate 12 is a semiconductor material and may be either a P-type semiconductor material or an N-type semiconductor material. Drain 20 and source 22 are inserts into substrate 12 and are P-type when substrate 12 is N-type, and are N-type when substrate 12 is P-type. Substrate 12 is constructed in a metal oxide semiconductor field effect transistor (MOSFET) configuration with respect to drain 20, source 22, and substrate 12, and may be either P-type or N-type depending upon the application of MFET 10. Oxide layer 24 is layered on substrate 12 and is etched away around drain 20 and source 22 to allow access thereto.

Figure 2:
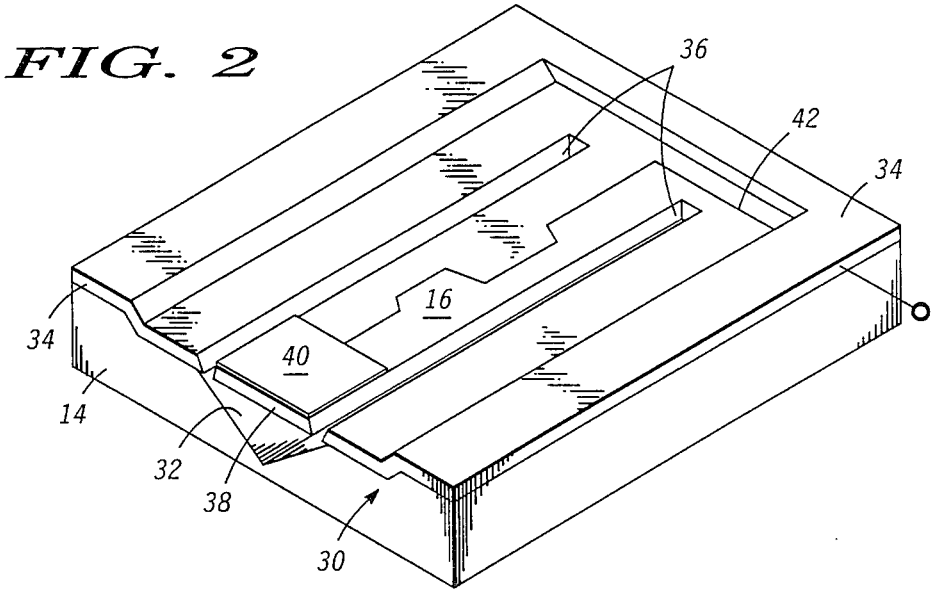
FIG. 2 is an isometric view of a portion of the mechanical sensor as seen along line 2—2 of FIG. 1.

FIG. 2 shows the configuration of base 14 and microbeam 16. Base 14 is originally a solid member and is preferably comprised of silicon. A portion of base 14 is then etched away to form step 30, and is further etched away within step 30 to form V-cavity 32. Deflectable oxide layer 34 is then secured to base 14 and plurality of grooves 36 are etched away to leave microbeam 16. In its preferred embodiment, deflectable oxide layer 34 is constructed of silicon oxides. In a cantilever configuration, free end 38 of microbeam 16 is free to move up or down with respect to base 14 within V-cavity 32.

Microbeam 16 further comprises gate member 40 and lead connector 42 as shown in FIG. 2. Gate member 40 is secured to free end 38 of microbeam 16 as shown in FIG. 2, and may be constructed of gold or other comparable conducting material. Lead connector 42 in FIG. 2 connects gate member 40 to a voltage source (not shown) external to MFET 10. Lead connector 42 is secured to microbeam 16 and extends outside of MFET 10.

Figure 3:
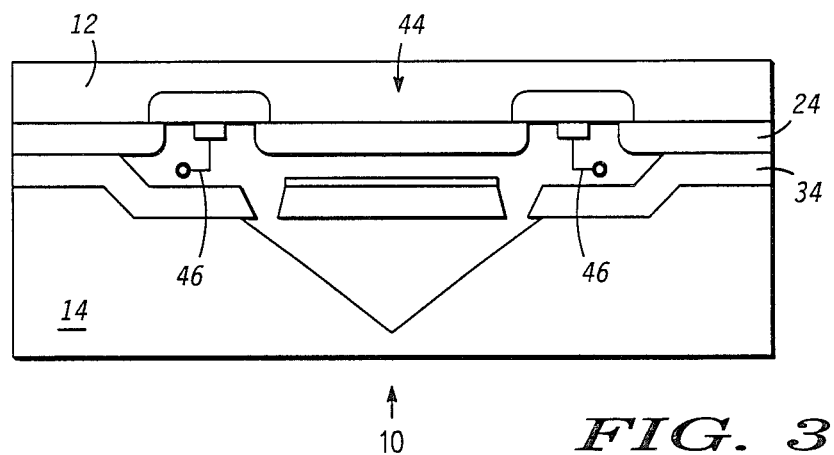
FIG. 3 is a front sectional view of the sensor.

FIG. 3 shows a front view of MFET 10. As shown, deflectable oxide layer 34 and oxide layer 24 of substrate 12 are secured together to join base 14 to substrate 12. When a force is applied to MFET 10 causing microbeam 16 to deflect towards substrate 12, a voltage applied to gate member 40 through lead 42 causes a change in the electron concentration in zone 44. Zone 44 may be either doped N-type material or doped P-type material. The type of material depends on whether MFET 10 is a P-type or N-type field effect transistor and whether MFET 10 is an enhancement MFET or a depletion MFET. As with a MOSFET, MFET 10 is normally "off" until gate member 40 causes the electron change in zone 44 for an enhancement MFET, and is normally "on" for a depletion MFET. Current flow is from drain 20 to source 22 through zone 44, and the current is supplied from and fed to an electronic circuit through plurality of leads 46.

Figure 4:
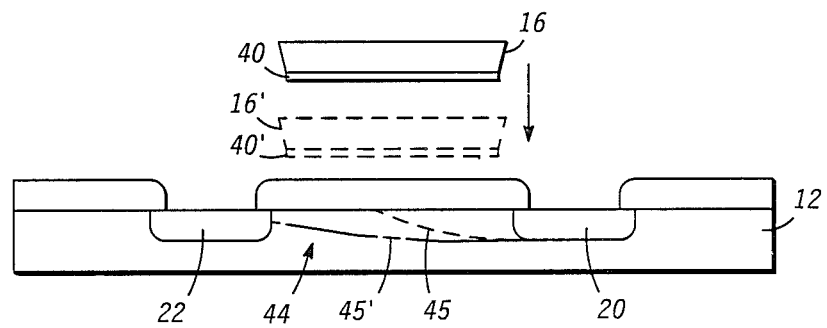
FIG. 4 is an expanded view of portions of FIG. 3.

In operation of an enhancement P-type MFET 10, a force applied to microbeam 16 will cause microbeam 16 to move up or down with respect to base 14. As microbeam 16 moves towards substrate 12 as shown by 16' and 40' in FIG. 4, the voltage applied to gate member 40 begins to create a "channel" 45 in zone 44 by attracting electrons to the surface of zone 44. The closer gate member 40 is to substrate 12, the more electrons are attracted to the surface, and the greater channel 45 becomes. When channel 45 is sufficiently great, it connects drain 20 to source 22 as indicated by 45' in FIG. 4, and allows current flow from drain 20 to source 22. The closer gate member 40 moves to substrate 12, the greater channel 45 is between drain 20 and source 22. The greater channel 45 is, the greater the amount of current which can flow. The width of channel 45 also depends on the amount of voltage applied to gate 40. One skilled in the art will recognize that a maximum width of channel 45 will be achieved when gate 40 is very close to substrate 12.

Microbeam 16 may be replaced with a deflectable diaphragm or deflectable simply supported beam. The diaphragm and simply supported beam would be constructed of silicon oxides similar to microbeam 16. The diaphragm and simply supported beam would be constructed from deflectable oxide layer 34 as with microbeam 16, and would deflect up and down with respect to base 14 when a force is applied. Gate member 40 is secured to the diaphragm in a similar manner as gate 40 is secured to microbeam 16 and is centrally situated with respect to the diaphragm.

Various alterations of MFET 10 are contemplated to adapt MFET 10 to specific uses. For instance, a ferrous material may be secured to microbeam 16 (and similarly to a diaphragm) opposite gate 40. This allows deflection of microbeam 16 when a magnetic field is encountered. Additionally, microbeam 16 and portions of oxide layer 34 may be appropriately doped with conducting material to allow lead 42 to be replaced by the doped portions of oxide layer 34 and microbeam 16.

Figure 5:
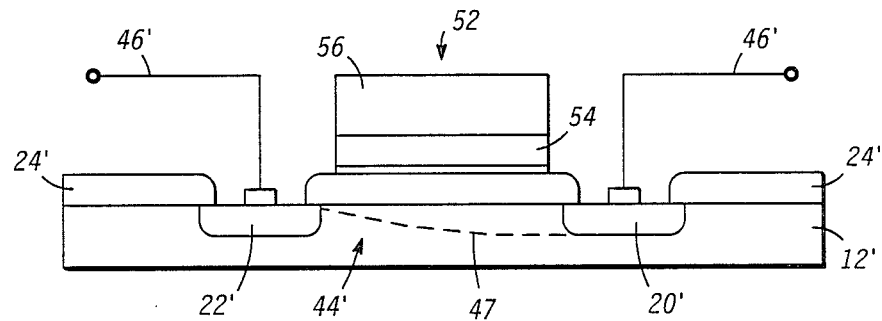
FIG. 5 is a front view of another embodiment of the sensor in accordance with the present invention.

FIG. 5 shows a second preferred embodiment of MFET 10, hereafter referred to as MFET 10'. MFET 10' comprises substrate 12' and gate 52. Substrate 12' comprises drain 20', source 22', oxide layer 24', and plurality of leads 46'. Substrate 12' further includes zone 44' which operates similar to zone 44 of MFET 10.

Gate 52 comprises piezoelectric material 54 and seismic mass 56. When a force causes motion within gate 52, piezoelectric material 54 is either compressed or expanded. This creates a small voltage within piezoelectric material 54 causing a change in the electron concentration within zone 44'. When piezoelectric material 54 is compressed, electrons are drawn to the surface of zone 44' creating channel 47 for electric current to flow from drain 20' to source 22'.

Seismic mass 56 operates to compress or expand piezoelectric material 54. Preferably, seismic mass 56 is constructed of a ferrous material allowing a force to be applied to seismic mass 56 from changes in acceleration and magnetic fields.

Since compression of piezoelectric material 54 creates a voltage sufficient to cause a change in the electron concentration in zone 44', gate 52 does not require a lead to an external voltage source in its preferred embodiment.

Thus, it is apparent that there has been provided, in accordance with the invention, a mechanical field effect transistor sensor that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A mechanical field effect transistor sensor comprising:
    semiconductor portion means for conducting a current when a surface concentration of electrons of said semiconductor portion means is altered;
    deflectable semiconductor means for sensing movement of the sensor;
    a bottom portion of said deflectable semiconductor means secured above said semiconductor portion means;
    said deflectable semiconductor means deflectable in a vertical direction with respect to said semiconductor portion means;
    gate means for altering said surface electron concentration of said semiconductor portion;
    said gate means micromachined onto a bottom side of a deflecting portion of said deflectable semiconductor means, and adjacent to said semiconductor portion.

2. A sensor according to claim 1 wherein said semiconductor portion means comprises:
    drain means for receiving a current from a primary source;
    source means for outputting said current;
    semiconductor substrate means for allowing said current to flow from said drain means to said source means when said surface electron concentration is altered; and
    said drain means and said source means fixedly secured to a plane of said semiconductor substrate means below said gate means.

3. A sensor according to claim 2 wherein said deflectable semiconductor means further comprises:
    end support means for securing said deflectable semiconductor means above said semiconductor means, said end support means secured to said semiconductor means;
    said deflecting portion deflecting when the sensor is subject to movement, said deflection proportional to a force caused by said movement;
    connector means for connecting said gate means to a voltage source; and
    said connector means including a first end coupled to said gate means and a second end coupled to said voltage source.

4. A sensor according to claim 3 wherein said deflectable support means comprises a cantilever microbeam.

5. A sensor according to claim 3 wherein said deflectable support means comprises a diaphragm.

6. A sensor according to claim 1 wherein the sensor is micromachined.

7. A micromachined mechanical field effect transistor sensor comprising:

semiconductor portion means for conducting a current when a surface concentration of electrons of said semiconductor portion means is altered;

deflectable semiconductor means for sensing movement of the sensor;

a bottom portion of said deflectable semiconductor means secured above said semiconductor portion means;

said deflectable semiconductor means deflectable in a vertical direction with respect to said semiconductor portion means;

gate means for altering said surface electron concentration of said semiconductor portion;

said gate means micromachined onto a bottom side of a deflecting portion of said deflectable semiconductor means, and adjacent to said semiconductor portion.

8. A micromachined mechanical field effect transistor sensor according to claim 7 wherein said semiconductor portion means comprises:

drain means for receiving a current from a primary source;

source means for outputting said current;

semiconductor substrate means for allowing said current to flow from said drain means to said source means when said surface electron concentration is altered; and said drain means and said source means fixedly secured to a plane of said semiconductor substrate means below said gate means.

9. A micromachined mechanical field effect transistor sensor according to claim 7 wherein said deflectable semiconductor means further comprises:

end support means for securing said deflectable semiconductor means above said semiconductor means, said end support means secured to said semiconductor means;

said deflecting portion deflecting when the sensor is subject to movement, said deflection proportional to a force caused by said movement;

connector means for connecting said gate means to a voltage source; and said connector means including a first end coupled to said gate means and a second end coupled to said voltage source.

* * * * *